(12) United States Patent
Takata et al.

(10) Patent No.: US 6,557,225 B2
(45) Date of Patent: May 6, 2003

(54) METHOD OF PRODUCING SURFACE ACOUSTIC WAVE DEVICE

(75) Inventors: Toshiaki Takata, Kanazawa (JP); Shuji Yamato, Ishikawa-ken (JP); Norihiko Takada, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 13 days.

(21) Appl. No.: 09/833,396

(22) Filed: Apr. 12, 2001

(65) Prior Publication Data

US 2001/0029650 A1 Oct. 18, 2001

(30) Foreign Application Priority Data

Apr. 13, 2000 (JP) .......................... 2000-112449
Feb. 13, 2001 (JP) .......................... 2001-034983

(51) Int. Cl.[7] .............................................. H04R 17/00
(52) U.S. Cl. .................. 29/25.35; 29/25.35; 29/846; 29/848; 216/49; 216/13; 216/55; 310/313 B; 310/365
(58) Field of Search ................. 29/846, 831, 847, 29/593, 857, 848; 216/49, 13, 55; 310/313 B, 365

(56) References Cited

U.S. PATENT DOCUMENTS

| 4,442,574 A | * | 4/1984 | Wanuga et al. ............ 29/25.35 |
| 4,810,920 A | * | 3/1989 | Yamamoto .............. 310/313 C |
| 4,857,016 A | * | 8/1989 | Benscoter et al. .......... 439/680 |
| 5,390,401 A | * | 2/1995 | Shikata et al. ............. 29/25.35 |
| 5,699,027 A | * | 12/1997 | Tsuji et al. ................. 333/193 |
| 5,746,868 A | * | 5/1998 | Abe ........................... 156/247 |
| 5,920,142 A | * | 7/1999 | Onishi et al. ........... 310/313 R |
| 5,991,989 A | * | 11/1999 | Onishi et al. .............. 29/25.35 |
| 6,103,552 A | * | 8/2000 | Lin ............................ 438/113 |

FOREIGN PATENT DOCUMENTS

| JP | 4-371009 | * | 12/1994 | ......... H03H/3/08 |
| JP | 9-172341 | * | 6/1997 | ......... H03H/9/145 |
| JP | 10-163789 | * | 6/1998 | ......... H03H/9/145 |

* cited by examiner

Primary Examiner—Carl J. Arbes
Assistant Examiner—Tai Nguyen
(74) Attorney, Agent, or Firm—Keating & Bennett, LLP (57) ABSTRACT

A method of producing a surface acoustic wave device by use of a flip chip process, includes the steps of forming on a piezoelectric substrate at least one interdigital transducer and a plurality of electrode pads electrically connected to the interdigital transducer, forming bumps on the respective electrode pads, and providing an insulating film at a region other than a region where the bumps are formed.

18 Claims, 7 Drawing Sheets

METHOD OF PRODUCING SURFACE ACOUSTIC WAVE DEVICE

BACKGROUND OF THE INVENTION

1. Field of the Invention

The present invention relates to a method of producing a surface acoustic wave device such as a surface acoustic wave filter or other device, and more particularly, to a method of producing a surface acoustic wave device having bumps formed by a flip chip process.

2. Description of the Related Art

In recent years, mobile communications equipment has been greatly reduced in size and weight. Also, it has been required to reduce the sizes of electronic parts for use in the mobile communications equipment. Thus, for surface acoustic wave devices used as band filters in mobile communication devices, miniaturization has been urgently required.

In conventional surface acoustic wave devices, surface acoustic wave elements are contained in a package. Electrode pads of the surface acoustic wave elements are electrically connected to electrode patterns provided for the package via wires. Accordingly, miniaturization of the surface acoustic wave devices has had a limit.

In recent years, the flip chip process has been utilized more frequently in which bumps are formed on electrode pads on a surface acoustic wave element, and the bumps are arranged to contact an electrode pattern on a package and are bonded to the pattern, e.g., by application of supersonic waves.

Japanese Unexamined Patent Application Publication No. 9-172341 discloses an example of a method of producing a surface acoustic wave device, using the above-mentioned flip chip process. In the surface acoustic wave device described as the conventional technique, a surface acoustic wave element is covered with a dielectric layer in order to enhance the anti-dust property and the corrosion resistance.

In particular, first, interdigital electrodes and planar electrodes defining electrode pads are formed on a piezoelectric substrate. Then, a dielectric layer defining a protection layer is formed on the piezoelectric substrate. Moreover, for electrical connection to the external upper electrodes each having the same areas as those of the planar electrodes when seen in plan view, are arranged such that the upper electrodes overlap the planar electrodes via the dielectric layer. Moreover, by bonding metal bumps to the upper electrodes, the dielectric layer is broken by the upper electrodes, so that the planar electrodes and the upper electrodes are electrically connected directly to each other. The metal bumps, after they are connected to the planer electrodes as described above, are connected to a package substrate in the above-mentioned flip chip process.

Figure 8:
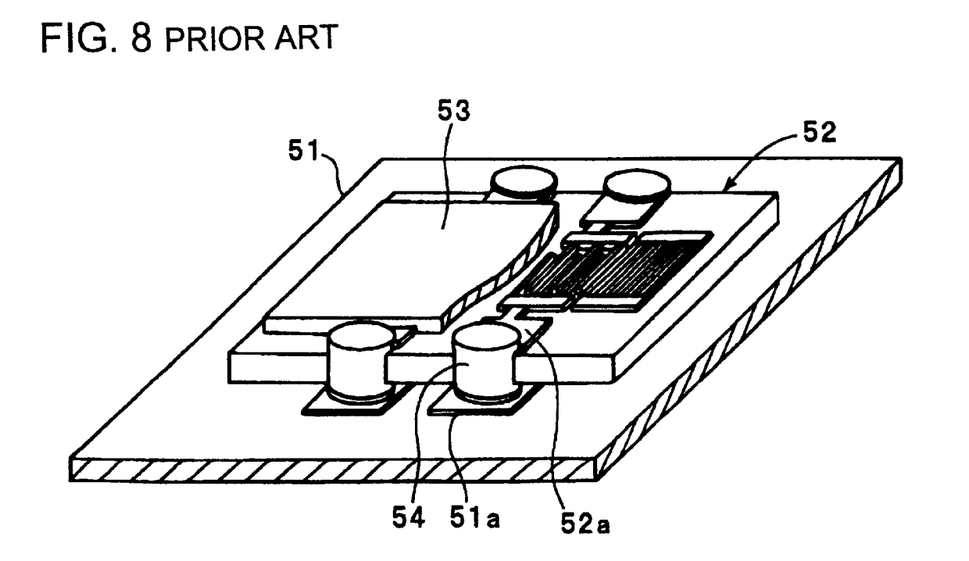
FIG. 8 is a perspective view illustrating an example of a conventional surface acoustic wave device.

On the other hand, Japanese Unexamined Patent Application Publication No. 10-163789 discloses the structure in which surface acoustic wave filter elements can be mounted onto a circuit substrate without the element being contained in a package. In particular, as shown in FIG. 8, a surface acoustic wave element 52 is mounted directly to a circuit substrate 51. For the purpose of realizing the above-mentioned mounting, the surface acoustic wave element 52 is formed as follows.

That is, first, interdigital electrodes, a reflector, an input electrode pad, and an output electrode are formed on a piezoelectric substrate. Then, a protection film 53 made of $SiO_2$ and having a film thickness of 200 Å to 15 μm is formed. Furthermore, the central portions of input-output electrode pads 52a are exposed from the protection film 53. An electro-conductive bonding agent 54 is made to adhere thereto. As the conductive bonding agent 54, a solder ball, a gold bump, or an electro-conductive resin is used. The conductive bonding agent 54 is arranged to contact a corresponding electrode pattern 51a of the circuit substrate 51. In the state in which the surface acoustic wave element 52 is placed onto a circuit substrate, the conductive bonding agent such as the solder ball is heated and melted, whereby the surface acoustic wave filter element is mounted directly to the circuit substrate 51.

Japanese Unexamined Patent Publication No. 4-371009 discloses a problem that a surface acoustic wave device likely experiences a pyroelectric breakdown due to a potential difference between electrodes which is caused by deposition of a passivation film on a piezoelectric substrate and heat applied during the formation of a window in the passivation film. To this end, the Publication discloses a method to connect between an input terminal and an output terminal via a connection wire before formation of a passivation film and disconnect the connection wire after formation of the passivation film, whereby the short-circuit between the input and output terminal prevents the pyroelectric breakdown.

In the case in which a surface acoustic wave element is bonded to a package substrate or a circuit substrate by use of a bump, it is necessary to heat a piezoelectric substrate during the process of forming the bump in order to promote the interdiffusion of metal, so that the bump shear strength can be increased.

However, in the case of a piezoelectric substrate having pyroelectric properties used, a potential difference is generated between the electrodes of the interdigital transducers as the surface acoustic wave element, due to changes in the temperature caused by the above heating is carried out. Thus, discharge occurs. Problematically, this discharge causes the interdigital transducer to be pyroelectrically broken, so that the acceptance ratio is reduced.

In addition, it is impossible to measure frequency characteristics of a device before formation of a passivation film if the input and output terminals are short-circuited before formation of the passivation film to prevent a pyroelectric breakdown. As a result, it is impossible to adjust an operation frequency of a device by changing a thickness of a passivation film. Even if it is possible to adjust an operation frequency of a device by disconnection a connection wire after formation of a passivation film, measuring an operation frequency of a device and changing a thickness of a passivation film, thereafter, there sill remains a problem of a pyroelectric breakdown as the connection wire has been cut during a formation of bumps.

SUMMARY OF THE INVENTION

In order to overcome the problems described above, preferred embodiments of the present invention provide a method of producing a surface acoustic wave device which can be mounted onto a package substrate or a circuit substrate, using a flip chip process, in which pyroelectric breaking of the interdigital transducer, caused by heating during formation of a bump, is prevented, and variations in characteristics are prevented, and the acceptance ratio is greatly improved.

According to a preferred embodiment of the present invention, a method of producing a surface acoustic wave device by use of a flip chip process, includes the steps of forming on a piezoelectric substrate, at least one interdigital transducer and a plurality of electrode pads electrically connected to the interdigital transducer, forming bumps on the respective electrode pads and providing an insulating film at a region other than a region where the bumps are formed.

In the present preferred embodiment, the insulating film greatly improves the dust resistance and erosion resistance in a surface acoustic wave device. Further, it is possible to miniaturize an electronic apparatus such as a communication apparatus in which a surface acoustic wave device is used as a surface acoustic wave device can be mounted on a circuit board by a flip-chip bonding method using the bumps.

The method may also include the step of forming an insulating film on an entire surface of the piezoelectric substrate, and removing a portion of the insulating film at least on the bumps.

In the case, since the portions of the insulating film on the bumps are removed, it is possible to easily mount the surface acoustic wave device on a circuit board by a flip-chip bonding method.

The method may further includes the step of etching a surface of the electrodes after the step of forming an insulating film.

In the case, the residue at the interface between the electrode pads and the bumps is removed. Therefore, it is possible to increase the strength of bonding between the electrode pads and the bumps. Further, since the bump area is enlarged due to the press of bumps during the bonding by ultrasonic energy application, the enlarged portion of the bump may further improve the bonding.

The step of forming the at least one interdigital transducer and electrode pads may include the step of forming a short-circuit wiring for short-circuiting between a signal terminal side and a ground terminal side of the at least one interdigital transducer, the method further including a step of cutting the short-circuit wiring between the second and third steps of the method.

In this preferred embodiment, the short-circuit wiring for short-circuiting can prevent a discharge by a pyroelectric effect. As a result, destruction of electrode fingers in the interdigital transducer is eliminated, which prevents deviation in the characteristics of the surface acoustic wave devices.

Also, it is possible to measure the frequency characteristics before forming an insulating film. Thus, it is possible to surely provide a surface acoustic wave device which has a predetermined characteristics. Further, the pyroelectric breakdown at the formation of bumps is also prevented.

The method may also further include, between the first and second steps, the steps of forming a conductive film on the back surface of the piezoelectric substrate which is opposite to the side where the interdigital transducer is formed, and short-circuiting the electrodes on the front surface of the piezoelectric substrate to the conductive film on the back surface by use of a conductive film or a conductive jig.

These steps prevent charges from accumulating and discharging at the surface of the piezoelectric substrate. Thus, it is possible to omit a short-circuit wiring and reduce the number of the manufacturing steps.

In the first step of the method, a plurality of interdigital transducers and a plurality of electrode pads electrically connected to the interdigital transducer may be formed on the piezoelectric substrate so as to form a filter circuit, and a conductive pattern substantially surrounding the filter circuit may be formed on the piezoelectric substrate.

Such a conductive pattern helps the charge at the front surface of the piezoelectric substrate towards the back surface of the piezoelectric substrate, thereby further enhancing the charge transfer.

The bumps may be made of the same material as that of metal pads which receive the bumps so as to improve the inter diffusion between the electrode pads and the bumps.

The thickness of the insulating film formed in the third step of the method may be selected to adjust a frequency of the surface acoustic wave device. In this case, the manufacturing steps may be reduced.

Alternatively, the third step of the method may include the steps of forming an insulating film on an entire surface of the piezoelectric substrate, and reducing a thickness of the insulating film so as to adjust a frequency of the surface acoustic wave device.

Further, the method according to preferred embodiments of the present invention may include the step of measuring the frequency of the surface acoustic wave device, before the step of adjusting the frequency of the surface acoustic wave device.

In this case, it is possible to realize high accurate frequency adjustment, thereby increasing production yield.

Other elements, features, characteristics and advantages of the present invention will become more apparent from the following detailed description of preferred embodiments thereof with reference to the attached drawings.

For the purpose of illustrating the invention, there is shown in the drawings several forms which are presently preferred, it being understood, however, that the present invention is not limited to the precise arrangements and instrumentalities shown.

DETAILED DESCRIPTION OF PREFERRED EMBODIMENTS

Hereinafter, the present invention will be more apparent from the following description of specific preferred embodiments of the present invention made with reference to the drawings.

FIGS. 1A to 1D are plan views showing a production method according to a preferred embodiment of the present invention. FIGS. 2A to 2D are cross sectional views showing the production method of this preferred embodiment.

First, a substantially rectangular-plate shaped piezoelectric substrate is prepared. For this piezoelectric substrate, piezoelectric ceramics such as ceramics of a lead titanate zirconate type or other suitable material may be used. According to the production method of preferred embodiments of the present invention, pyroelectric breaking can be prevented as described later, even if a piezoelectric substrate 1 has a pyroelectric property.

An electroconductive material such as Al or other suitable material is applied to the entire upper surface of the piezoelectric substrate in an appropriate method such as vapor deposition, sputtering, plating, or other suitable process to form an electroconductive film.

Succeedingly, a positive photo-resist layer is formed on the conductive film. A mask of which the shield portions correspond to an interdigital transducer (hereinafter, referred to as IDT), an electrode portion such as a reflector, and so forth is placed to cover the photoresist layer, followed by exposure. After this, the exposed photoresist portions are removed, whereby the photoresist layer is patterned.

Figure 1A:
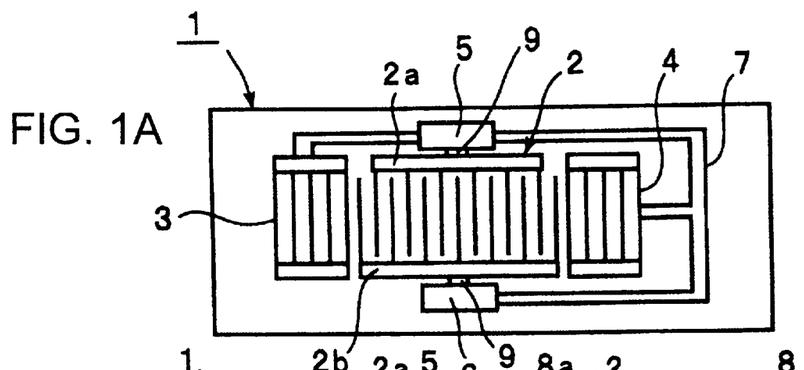
FIGS. 1A to 1D are plan views illustrating a method of producing a surface acoustic wave device according to a first preferred embodiment of the present invention.

Thereafter, etching is conducted by use of an etchant which is incapable of attacking the photoresist and is capable of removing the conductive film. Thus, as shown in FIG. 1A, an IDT 2, reflectors 3 and 4, electrode pads 5 and 6, wiring electrodes 9a and 9b, and a short-circuit wiring 7 are formed on a piezoelectric substrate 1.

Here, the IDT 2 includes a pair of interdigital electrodes, and the reflectors 3 and 4 are arranged on both of the sides of the IDT 2 in the surface acoustic wave propagation direction. The electrode pads 5 and 6 constitute input-output electrode pads, and are connected to the interdigital electrodes of the IDT 2, respectively. The short-circuit wiring 7 connects the electrode pads 5 and 6 to the reflectors 3 and 4, respectively. That is, the short-circuit wiring 7 electrically connects the input-output sides of the IDT 2 and the sides of the IDT 2 which are connected to the ground potential to each other. Wiring electrodes 9a and 9b electrically connect the electrode pads 5 and 6 to the IDT 2, respectively.

Referring to the above etching process, both of wet and dry etching methods may be used. Furthermore, the respective electrodes may be formed via a lift-off method or other suitable process.

Figure 1B:
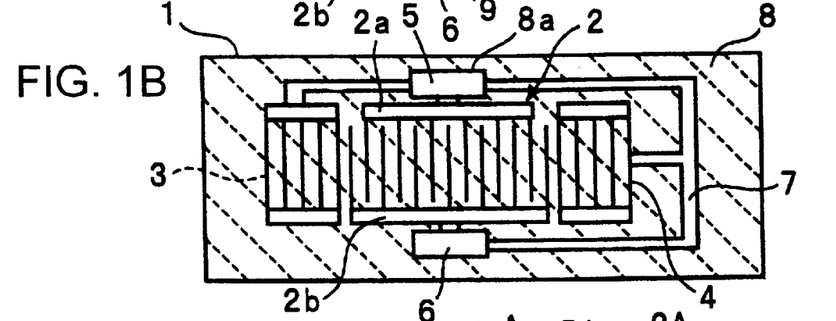

Succeedingly, a positive photoresist is applied to the whole surface of the piezoelectric substrate 1. Thereafter, the mask in which the portions overlapping the bus bars 2a and 2b of the IDT 2, the electrode pads 5 and 6, and the wiring electrodes 9a and 9b are formed in openings, is laminated to the photoresist, followed by exposure with light. Then, the exposed photoresist portions are removed. Thus, as shown in FIG. 1B, openings 8a are formed in the photoresist layer 8. It should be noted that the electrodes such as the IDT 2 lying under the photoresist layer 8 are concealed, but are drawn in solid lines in FIG. 1B. Through the openings 8a, the electrode pads 5 and 6, the bus bars 2a and 2b, and the wiring electrodes 9a and 9b are exposed, as described above.

Succeedingly, the photoresist layer 8 is heated, so that adhesion of the photoresist layer 8 to the piezoelectric substrate 1 and also the plasma resistance thereof are greatly improved.

In this case, the electrode pads 5 and 6, and the reflectors 3 and 4 are short-circuited via the short-circuit wiring 7, and therefore, the respective portions have the same potential. Accordingly, even if the piezoelectric substrate 1 has a pyroelectric property, no discharge occurs, which may caused by pyroelectric effects. That is, there is no possibility that the IDT 2 and the resist 8 are broken.

Then, a second electroconductive film is formed on the whole surface of the piezoelectric substrate 1. The second conductive film is applied in order that the bus bars 2a and 2b, the input-output pads 5 and 6, and the wiring electrodes 9a and 9b each have a two layer structure, as described later. That is, with the second conductive film being formed within the openings 8a, the bus bars 2a and 2b, the input-output pads 5 and 6, and the wiring electrodes 9a and 9b each preferably have a two layer structure.

After this, the portion of the second conductive film applied on the photoresist layer 8 is lifted off together with the photoresist layer 8. Similarly, the electrodes pads 5A and 6A, and the bus bars 2A and 2B each having a two layer structure are formed on the piezoelectric substrate 1, as schematically shown in the cross section of FIG. 2A.

Figure 1C:
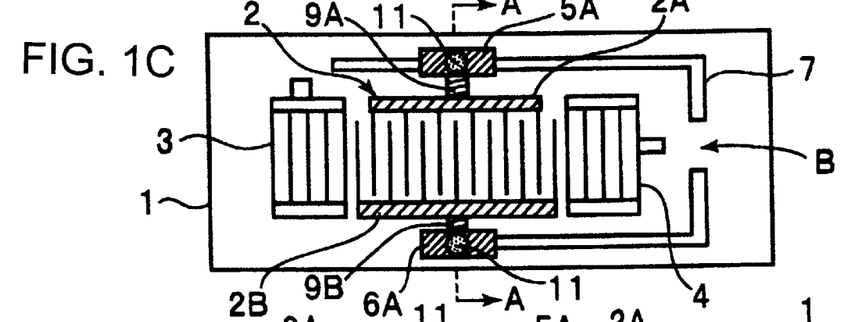
Figure 2A:
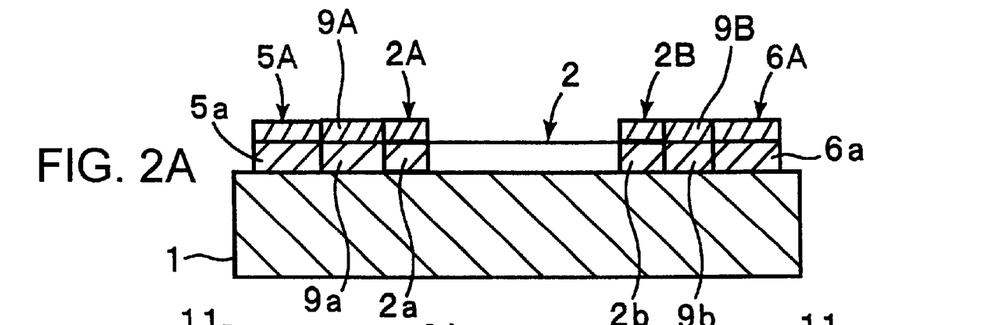
FIGS. 2A to 2D are cross sectional side views illustrating the method of producing the surface acoustic wave device according to the first preferred embodiment of the present invention.

In FIG. 2A, the short-circuit wiring 7 is not shown, since FIG. 2A is a cross sectional view showing the surface acoustic wave device part taken along line A—A in FIG. 1C.

As described above, the reason for the formation of the electrodes films having two layer structure lies in that the piezoelectric substrate 1 is prevented from being cracked when metal bumps are formed. Accordingly, it is preferable that the electrodes pads are formed so as to have a two layer structure. The bus bars and the wiring do not have to have a two layer structure.

Figures 2B, 2C:
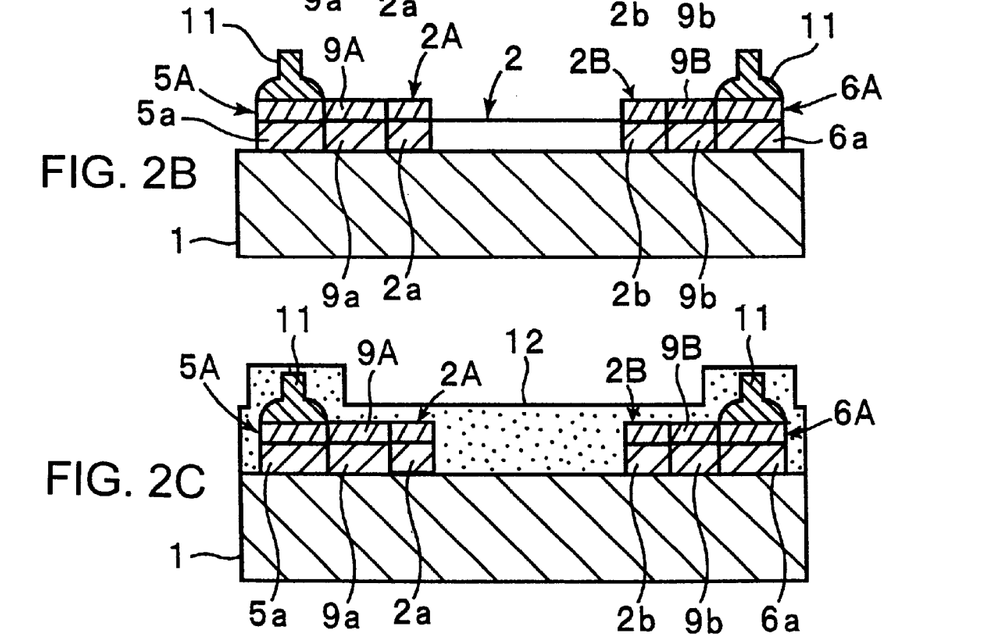

Succeedingly, as shown in FIG. 2B, metal bumps 11 are formed on the electrode pads 5A and 6A, respectively. As material for the metal bumps 11, electroconductive materials such as gold, Al, Al alloys or other suitable material may be used.

When the above metal bumps 11 are formed, the piezoelectric substrate 1 is heated. The heating of the piezoelectric substrate 1 promotes the interdiffusion between the metal in the second layer and the metal constituting the metal bumps 11, so that the metal bumps 11 are strongly bonded to the electrode pads 5A and 6A, respectively. In this case, since the electrode pads 5 and 6 and the reflectors 3 and 4 are short-circuited, the respective portions have the same potential with no potential difference between them. Therefore, no discharge occurs. Accordingly, breaking of the IDT 2 and the resist 8 can be prevented.

Succeedingly, as seen in FIG. 1C, the short-circuit wiring 7A is cut in the portion thereof indicated by arrow B.

Figure 1D:
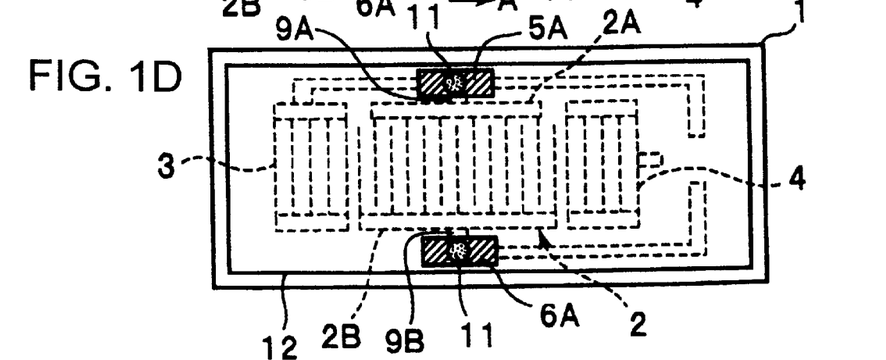

Moreover, as shown in FIG. 1D and FIG. 2C, an insulation film 12 is formed nearly on the entire piezoelectric substrate 1. The insulation film 12 is preferably formed e.g., by sputtering an insulation material such as $SiO_2$ or other suitable material.

The thickness of the insulation film 12 is preferably arranged such that the frequency of the surface acoustic wave has a desired value.

Figure 2D:
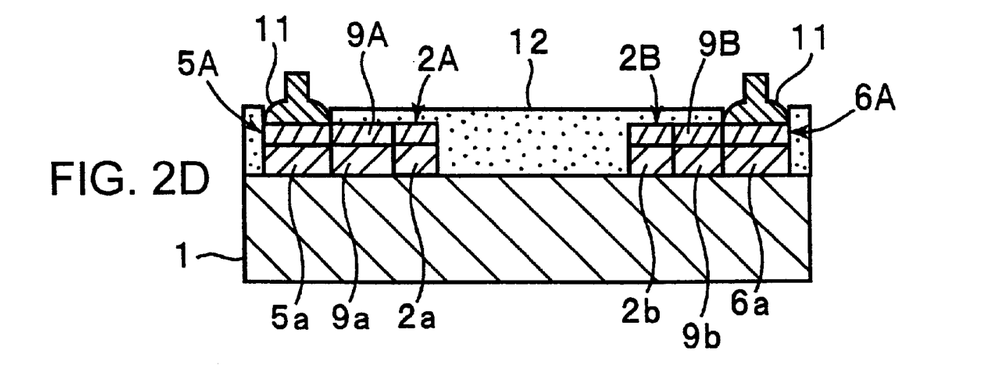

Next, as shown in FIG. 2D, in this preferred embodiment, the insulation film 12 lying on the metal bumps 11 and also on the input-output pads 5A and 6A is removed in order that they can be connected to an external circuit. Thus, a high die shear strength can be obtained.

Figure 3:
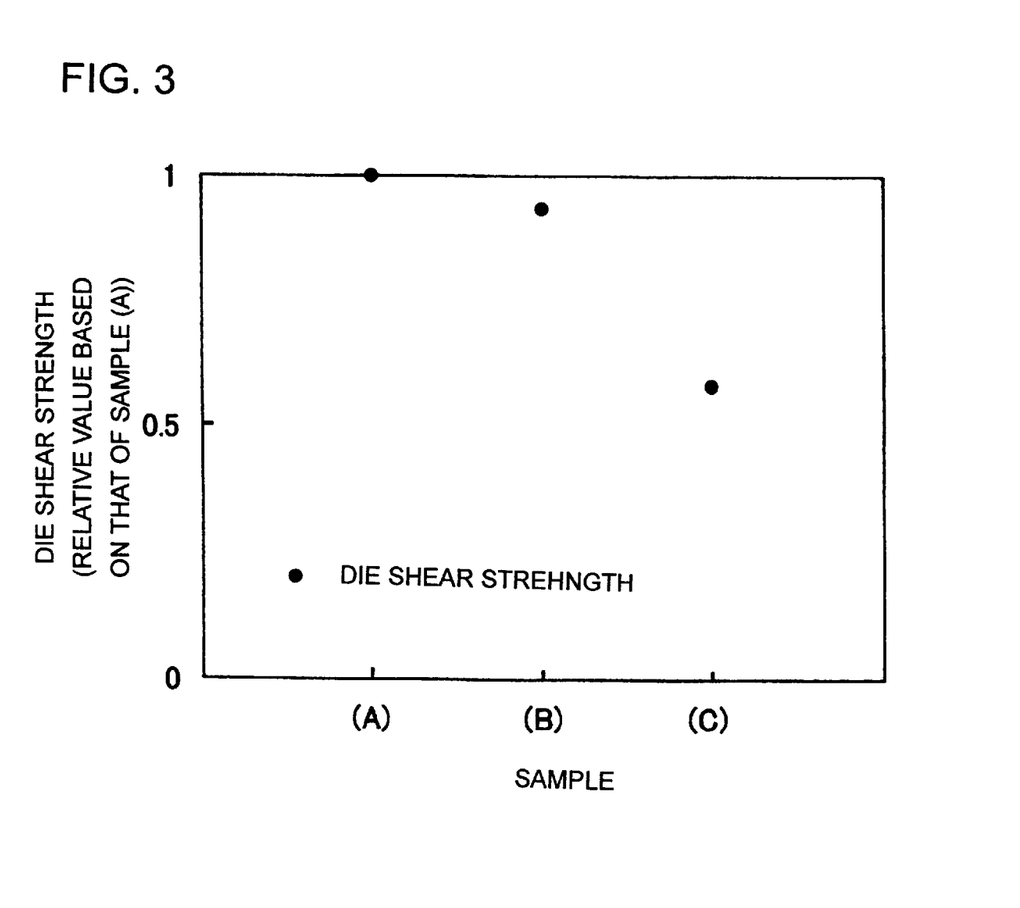
FIG. 3 is a graph showing the die shear strengths of the surface acoustic wave device obtained in the production method of the first preferred embodiment, a surface acoustic wave device obtained in a production method as a modified example, and a surface acoustic wave device prepared for comparison.

The surface acoustic wave device 13 of this preferred embodiment was bonded to an electrode pattern made of gold, Al, an Al alloy, or other suitable material on a circuit substrate with an ultrasonic wave being applied, in a flip chip process. The die shear strength of the sample B produced in this case was evaluated. FIG. 3 shows the results.

Regarding the surface acoustic wave device used for the measurement of the die shear strength, as a piezoelectric substrate material, lithium tantalate was used. The material used for the electrodes is preferably Al. As material for the bumps, a material containing Au is preferably used. Moreover, $SiO_2$ is preferably used as an insulation film material.

Furthermore, the surface acoustic wave device which was obtained in a similar manner as the sample B except no formation of the insulation film 12 was used as sample A, and similarly, the die shear strength was evaluated. Moreover, the sample in which the insulation film 12 lying on the metal bumps 11 was not removed was prepared as sample C, and similarly, the evaluation was made. These results are shown in FIG. 3, respectively.

As seen in FIG. 3, the die shear strength of the sample C is low. Also, it is seen that the sample B has a high die shear strength as well as the sample A.

A surface acoustic wave device according to a second preferred embodiment and a method of producing the same will be described with reference to FIGS. 4A to 6.

Figure 4A:
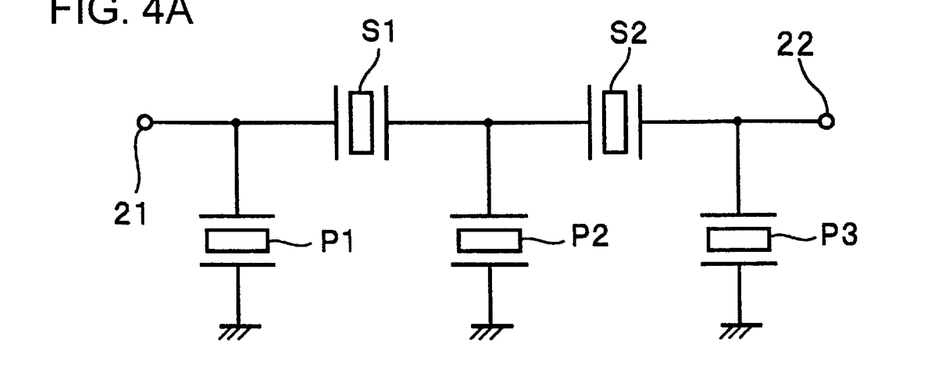
FIG. 4A illustrates an example of the circuit configuration of a surface acoustic wave device according to a second preferred embodiment of the present invention.

FIG. 4A illustrates the configuration of the circuit of the surface acoustic wave device according to the second preferred embodiment. In this preferred embodiment, five surface acoustic wave elements are connected so as to define a ladder-type circuit configuration. Thus, a ladder type filter is provided. In particular, two series arm resonators S1 and S2 are connected between an input terminal 21 and an output terminal 22. Parallel arm resonators P1 to P3 are connected between the series arm and the ground potential.

The series arm resonators S1 and S2 and the parallel resonators P1 to P3 shown in FIG. 4A each have an electrode configuration similar to that of the surface acoustic wave device of the first preferred embodiment. That is, each of them includes an IDT arranged in the approximate center in the surface acoustic wave propagation direction thereof, and reflectors arranged on both of the sides of the IDT in the propagation direction, and electrode pads each connected to a pair of the interdigital electrodes of the IDT.

Figure 4B:
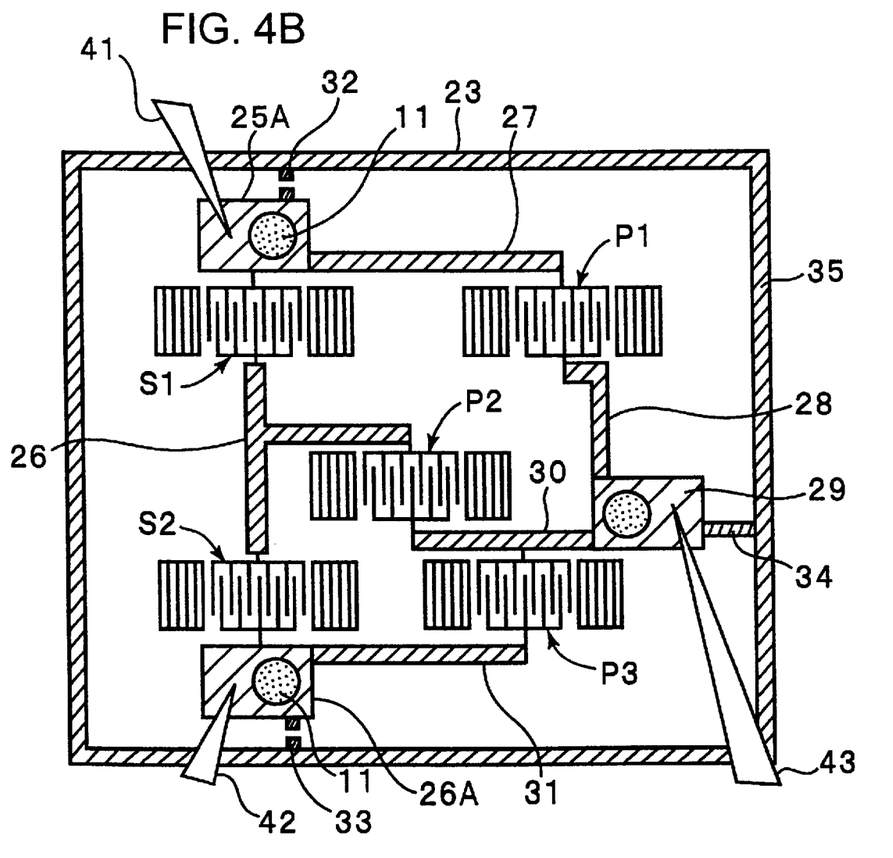
FIG. 4B is a schematic plan view of the surface acoustic wave device.

FIG. 4B is a schematic plan view of the surface acoustic wave device of this preferred embodiment. The series arm resonators S1 and S2 and the parallel arm resonators P1 to P3 are disposed on a substantially rectangular piezoelectric substrate 23.

One electrode bump 11 is provided on the electrode pad 25A connected to a bus bar of the IDT of the series arm resonator S1. Similarly, another other bump 11 is formed on the electrode pad 26A connected to one bus bar of the IDT of the series arm resonator S2. Moreover, the series arm resonators S1 and S2 are electrically connected to each other via a wiring electrode 26. The wiring electrode 26 connects the series arm resonators S1 and S2 to the parallel resonator P2.

Moreover, one end of a wiring electrode 27 is connected to the electrode pad 25A, and the other end of the wiring electrode 27 is connected to one end of the parallel arm resonator P1.

A wiring electrode 28 is connected to the other end of the parallel arm resonator P1, and the other end of the wiring electrode 28 is connected to an electrode pad 29. Yet another bump 11 is formed on the electrode pad 29. The end of the parallel arm resonator P2 which is opposite to the side thereof where the wiring electrode 26 is connected to the electrode pad 29 and one end of the parallel arm resonator P3. The other end of the parallel arm resonator P3 is connected to the electrode pad 26A via a wiring electrode 31.

In this preferred embodiment, an insulation film (not shown) is formed so as to cover the piezoelectric substrate and the electrode structure excluding the electrode pads 25A, 16A, and 29.

Furthermore, in FIG. 4B, probes 41 to 43 for adjusting the frequency come into contact with the electrode pads 25A, 26A, and 29. The contact of the probes 41 to 43 is carried out for wafer probing. In this case, it is desirable that the probes 41 to 43 are not in direct contact with the bumps 11. Moreover, to obtain a frequency more approximate to that of a finished product, short-circuit wirings 32 and 33 on the input-output sides are cut, and a short-circuit wiring 34 having the ground potential is short-circuited to a substantially rectangular grating 35 enclosing all of the circuits of the surface acoustic wave device.

Figure 7:
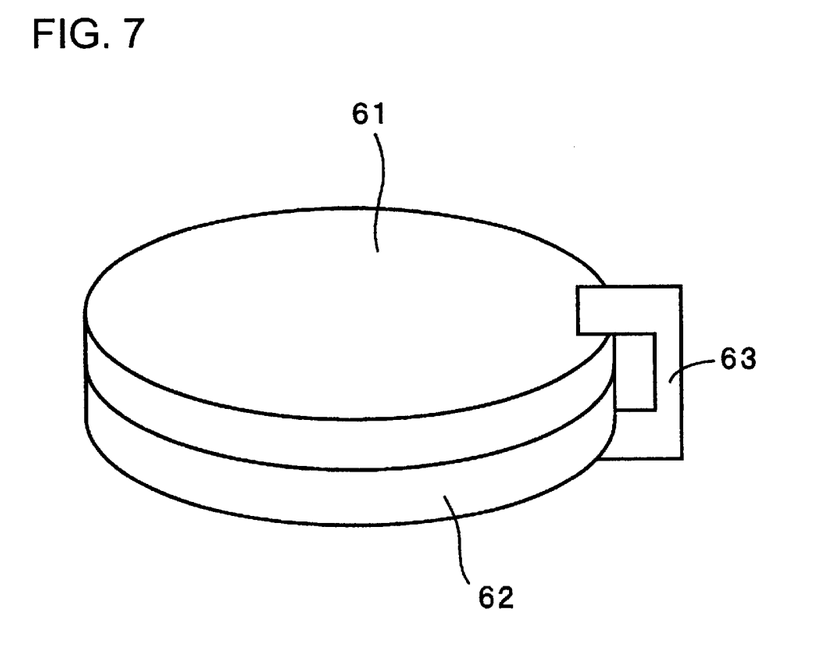
FIG. 7 is a perspective view illustrating a modified example of preferred embodiments of the present invention.

As shown in FIG. 7, a conductive film 62 made of gold, Al, an Al alloy, or other suitable material is formed on the back surface of a wafer 61. The wafer may be clipped with an appropriate jig 63 such as a clip or other tool provided between the front and back surfaces thereof for electrically short-circuiting. In this processing, the grating 35 formed on the front surface of the wafer 61 is electrically short-circuited to a conductive film 62 on the back surface of the wafer.

Figure 5A:
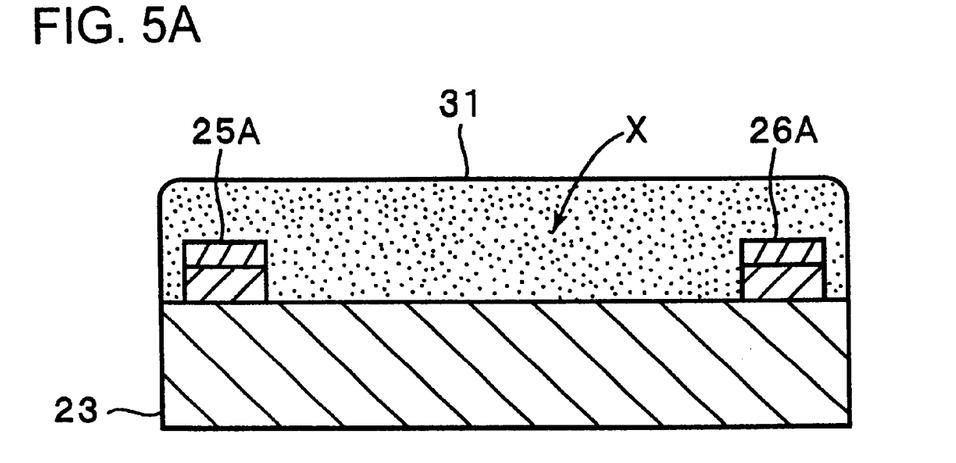
FIGS. 5A and 5B are cross sectional side views illustrating a process of reducing the thickness of an insulation film to adjust the frequency in the method of producing the surface acoustic wave device of the second preferred embodiment of the present invention.

FIG. 5A is a schematic cross sectional view showing the piezoelectric substrate 23 having the insulation film 31 formed thereon. The series arm resonators S1 and S2 and the wiring electrode 26 are formed in the area between the electrode pads 25A and 26A indicated by arrow X, though they are not shown. In this case, regarding the frequency characteristic of the surface acoustic wave device prior to formation of the insulation film 31 is preferably higher than a desired frequency. Then, in the state shown in FIG. 5A, the thick insulation film 31 is formed so that the frequency characteristic is lower than the desired frequency.

Next, the frequency characteristic of the surface acoustic wave device is measured by use of the probes 41 to 43. Based on the measurement results, an adjustment amount of the frequency characteristic is determined. That is, the difference between the frequency after the formation of the insulation film and the desired frequency is determined.

Figure 5B:
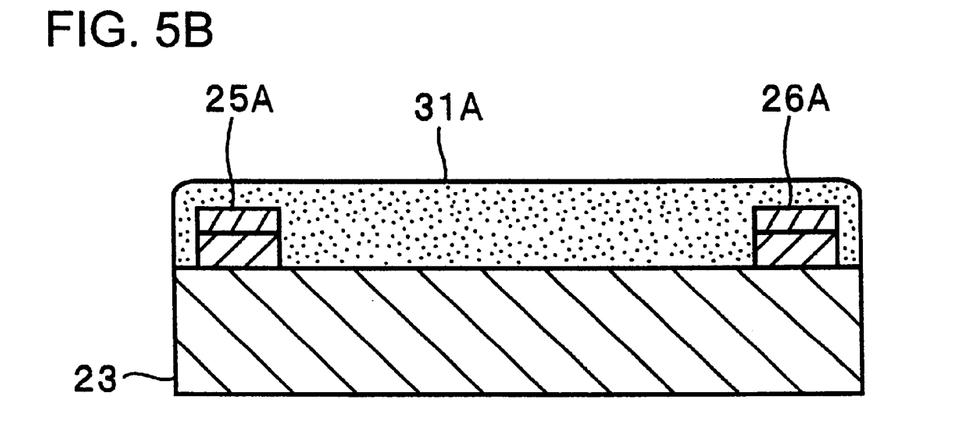

Thereafter, based on the above frequency difference, the insulation film 31 is etched, so that the thickness of the insulation film 31 is reduced. The thickness reduction amount of the insulation film 31 is obtained correspondingly to the frequency difference. As a result, the insulation film 31A having a thickness reduced correspondingly to the frequency adjustment amount is formed as shown in FIG. 5B. For this etching, wet-etching, dry-etching using plasma or another suitable process may be used.

As described above, in the surface acoustic wave device of this preferred embodiment, the thickness of the insulation film 31 can be reduced while the frequency characteristic of the surface acoustic wave device practically produced is measured by use of the probes 41 to 43. Thus, the surface acoustic wave device having a desired frequency characteristic can be securely provided.

Figure 6:
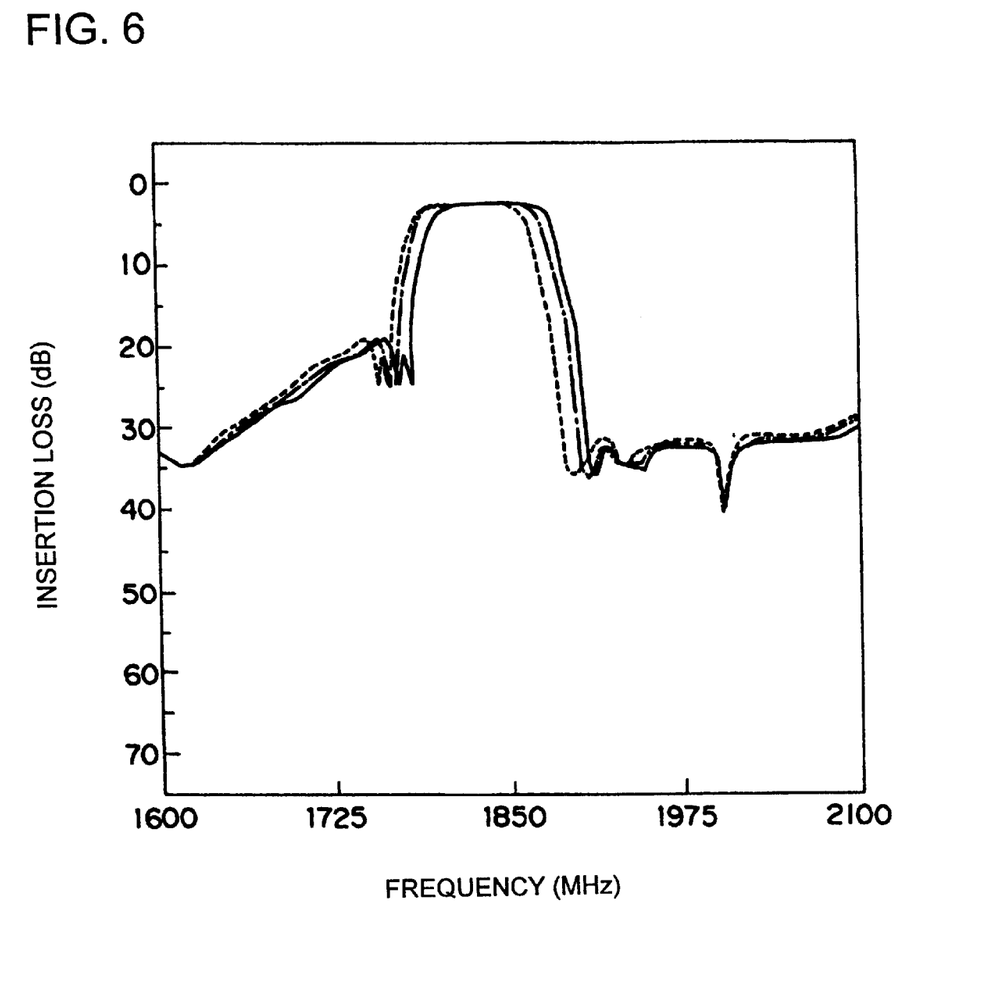
FIG. 6 is a graph illustrating changes in the frequency characteristic caused when the frequency adjustment is carried out in the production method of the second preferred embodiment of the present invention.

FIG. 6 is a graph showing changes in frequency characteristic of the surface acoustic wave device of this preferred embodiment. In FIG. 6, the solid line represents the frequency characteristic of the surface acoustic wave device before the formation of the insulation film 31. The broken line represents the frequency characteristic of the surface acoustic wave device in which the insulation film 31 having a thickness of about 29 nm is formed. Moreover, the alternate long and short dash line represents the frequency characteristic of the surface acoustic wave device after the frequency is adjusted (the thickness of the insulation film is reduced to about 13 nm). As seen in FIG. 6, adjustment of the frequency can be performed by etching the insulation film 31 preferably made of $SiO_2$ to reduce the thickness.

The surface acoustic wave devices of the first and second preferred embodiments and methods of producing the same can be applied to various surface acoustic wave devices such as a ladder filter in which a plurality of resonators are connected as shown in the second preferred embodiment, or other suitable arrangements. That is, the present invention can be applied to various surface acoustic wave devices such as surface acoustic wave resonators, surface acoustic wave filters, surface acoustic wave duplexers, and so forth. In addition, preferred embodiments of the present invention can be applied to surface acoustic wave devices having no reflectors.

Moreover, the piezoelectric substrate, which is not limited to ceramics of a lead titanate zirconate type, may be formed by use of piezoelectric single crystals such as $LiTaO_3$, $LiNbO_3$, quartz, lithium tetraborate, langasite, or other suitable materials. Moreover, a piezoelectric substrate including a piezoelectric thin film made of ZnO or other suitable material formed on an insulation substrate made of alumina or other suitable material may be used.

Electrode materials for the IDTs, the reflectors, and the short-circuit wirings, and other elements may include an optional electro-conductive material in addition to Al and an Al alloy.

Moreover, material for constituting the insulation film used for frequency adjustment is not limited to $SiO_2$. SiN, ZnO, or other suitable materials may be used.

While preferred embodiments of the invention have been disclosed, various modes of carrying out the principles disclosed herein are contemplated as being within the scope of the following claims. Therefore, it is understood that the scope of the present invention is not to be limited except as otherwise set forth in the claims.

What is claimed is:

1. A method of producing a surface acoustic wave device by use of a flip chip process, comprising the steps of:
    (A) forming on a piezoelectric substrate, at least one interdigital transducer and a plurality of electrode pads electrically connected to the interdigital transducer;
    (B) forming bumps on the respective electrode pads; and
    (C) providing an insulating film at a region other than a region where the bumps are formed; wherein
        the step (C) includes the steps of:
            forming the insulating film on an entire surface of the piezoelectric substrate; and
            removing a portion of the insulating film at least on the bumps.

2. A method of producing a surface acoustic wave device according to claim 1, further comprising the step of etching a surface of the electrodes after the step (C).

3. A method of producing a surface acoustic wave device by use of a flip chip process, comprising the steps of:
    (A) forming on a piezoelectric substrate, at least one interdigital transducer and a plurality of electrode pads electrically connected to the interdigital transducer;
    (B) forming bumps on the respective electrode pads; and
    (C) providing an insulating film at a region other than a region where the bumps are formed; wherein
        the step (A) includes the step of forming a short-circuit wiring for short-circuiting between a signal terminal side and a ground terminal side of the at least one interdigital transducer, the method further comprising a step of cutting the short-circuit wiring between the step (B) and the step (C).

4. A method of producing a surface acoustic wave device according to claim 3, wherein the bumps are made of a material that is the same as that of metal pads which receive the bumps.

5. A method of producing a surface acoustic wave device according to claim 3, wherein the piezoelectric substrate is substantially rectangular-plate shaped and is made of piezoelectric ceramics.

6. A method of producing a surface acoustic wave device according to claim 3, wherein the at least one interdigital transducer includes a pair of interdigital electrodes and reflectors arranged on both sides of the interdigital transducer.

7. A method of producing a surface acoustic wave device according to claim 6, wherein a short circuit wiring connects the electrode pads to the reflectors.

8. A method of producing a surface acoustic wave device according to claim 3, further comprising the step of forming wiring electrodes so as to electrically connect the electrode pads to at least one IDT.

9. A method of producing a surface acoustic wave device according to claim 3, further comprising the step of removing a portion of the insulation film via one of a wet etching process and a dry etching process.

10. A method of producing a surface acoustic wave device according to claim 3, further comprising a second electro-conductive film on the whole surface of the piezoelectric substrate.

11. A method of producing a surface acoustic wave device according to claim 3, further comprising the step of forming bus bars, input-output pads, and wiring electrodes.

12. A method of producing a surface acoustic wave device according to claim 3, wherein each of the bus bars, the input-output pads and the wiring electrodes has a two layer structure.

13. A method of producing a surface acoustic wave device according to claim 3, wherein each of the electrode pads have a two layer structure.

14. A method of producing a surface acoustic wave device by use of a flip chip process, comprising the steps of:
    (A) forming on a piezoelectric substrate, at least one interdigital transducer and a plurality of electrode pads electrically connected to the interdigital transducer;
    (B) forming bumps on the respective electrode pads; and
    (C) providing an insulating film at a region other than a region where the bumps are formed; further comprising, between the step (A) and the step (B) the steps of:
        forming a conductive film on a back surface of the piezoelectric substrate which is opposite to a surface where the interdigital transducer is formed; and
        short-circuiting the electrodes on a front surface of the piezoelectric substrate to the conductive film on the back surface.

15. A method of producing a surface acoustic wave device according to claim 14, wherein in the step (A), a plurality of interdigital transducers and a plurality of electrode pads electrically connected to the interdigital transducer are formed on the piezoelectric substrate so as to form a filter circuit, a conductive pattern substantially surrounding the filter circuit is formed on the piezoelectric substrate.

16. A method of producing a surface acoustic wave device by use of a flip chip process, comprising the steps of:

(A) forming on a piezoelectric substrate, at least one interdigital transducer and a plurality of electrode pads electrically connected to the interdigital transducer;

(B) forming bumps on the respective electrode pads; and (C) providing an insulating film at a region other than a region where the bumps are formed; wherein a thickness of the insulating film formed in the step (C) is selected so as to adjust a frequency of the surface acoustic wave device.

17. A method of producing a surface acoustic wave device according to claim 16, wherein step (C) includes the steps of:

forming an insulating film on an entire surface of the piezoelectric substrate, and reducing a thickness of the insulating film so as to adjust a frequency of the surface acoustic wave device.

18. A method of producing a surface acoustic wave device according to claim 16, further comprising the step of measuring the frequency of the surface acoustic wave device, before the step of adjusting the frequency of the surface acoustic wave device.

* * * * *